(12) United States Patent
Singer et al.

(10) Patent No.: US 7,011,877 B2
(45) Date of Patent: Mar. 14, 2006

(54) METHOD FOR TREATING AN OPTICAL DISC LAYER TO IMPROVE ADHESION PROPERTIES

(75) Inventors: Barry Alexander Singer, Los Angeles, CA (US); Robert I. Freedman, Culver City, CA (US)

(73) Assignee: National Film Laboratories, Inc., Hollywood, CA (US)

( * ) Notice: Subject to any disclaimer, the term of this patent is extended or adjusted under 35 U.S.C. 154(b) by 0 days.

(21) Appl. No.: 10/969,558

(22) Filed: Oct. 19, 2004

(65) Prior Publication Data

US 2005/0053754 A1 Mar. 10, 2005

Related U.S. Application Data

(62) Division of application No. 10/302,330, filed on Nov. 22, 2002.

(51) Int. Cl.
*B32B 3/02* (2006.01)
(52) U.S. Cl. .................. 428/64.1; 428/65.2; 216/34
(58) Field of Classification Search ............ 428/64.1, 428/64.4, 65.2, 913; 430/270.11, 495.1, 430/945; 216/34
See application file for complete search history.

(56) References Cited

U.S. PATENT DOCUMENTS

| 4,957,603 A * | 9/1990 | Hennessey ............ 204/192.27 |
| 5,312,714 A * | 5/1994 | Ogawa .................. 430/270.21 |
| 6,030,680 A * | 2/2000 | Hahn et al. ................ 428/64.1 |
| 6,120,870 A * | 9/2000 | Nebashi et al. ............ 428/64.1 |
| 6,383,573 B1 * | 5/2002 | Beck et al. ................. 427/491 |

* cited by examiner

*Primary Examiner*—Elizabeth Mulvaney
(74) *Attorney, Agent, or Firm*—O'Melveny & Myers LLP

(57) ABSTRACT

A method of improving the ability of plastic layers of a multi-layered optical disc to bond to adhesive materials includes exposing the plastic layers to a plurality of ions. In one embodiment, one side of a plastic layer of a multi-layered optical disc is exposed to a plurality of non-reactive ions, an adhesive material is applied to the side of the plastic layer that was exposed to the plurality of ions, and a second layer of the optical disc is secured to the adhesive material. In another embodiment, a plurality of ions is formed by directing gas molecules through an electric field, and at least 25% of the width of the plastic layer of the multi-layered optical disc is exposed to the plurality of ions at about the same time. The plastic layer is positioned so that the ions contact the plastic layer while the ions still have a charge, and the disc is moved so that at least 25% of the surface of the plastic layer is exposed to the plurality of ions.

19 Claims, 2 Drawing Sheets

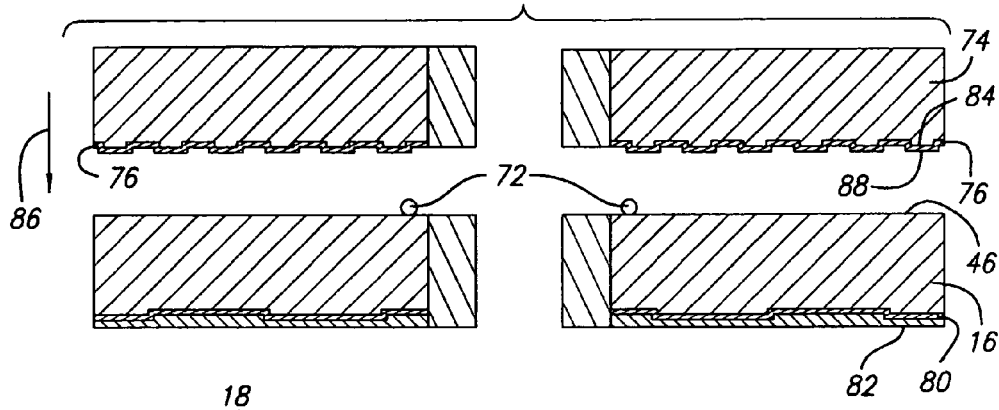
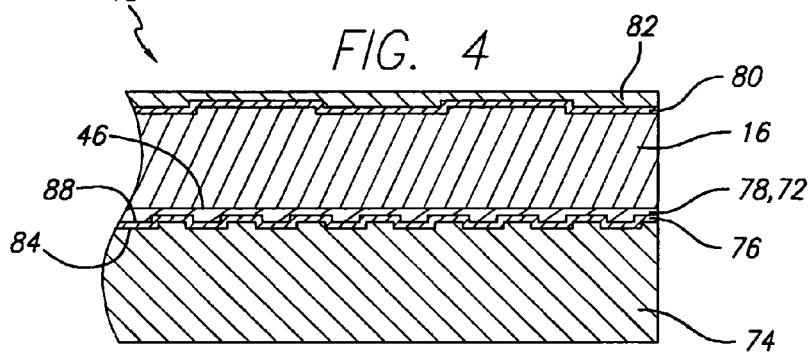
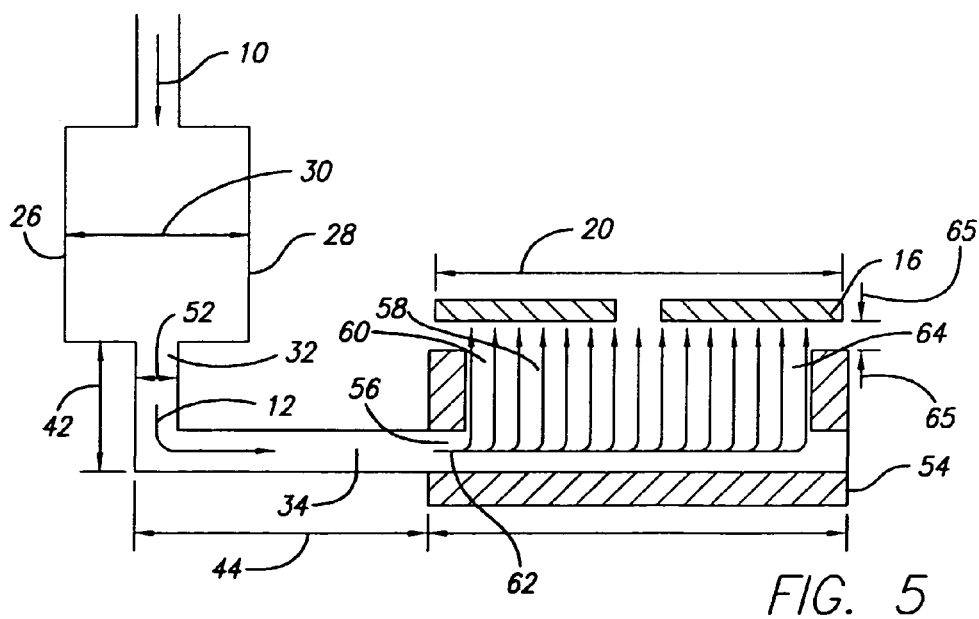

METHOD FOR TREATING AN OPTICAL DISC LAYER TO IMPROVE ADHESION PROPERTIES

RELATED APPLICATION

This application is a divisional of co-pending application Ser. No. 10/302,330, filed Nov. 22, 2002.

BACKGROUND OF THE INVENTION

1. Field of the Invention

The present invention relates generally to optical disc media, and more particularly to improving the bonding ability of plastic layers of a multi-layered optical disc by exposing the plastic layers to a plurality of ions.

2. Description of Related Art

It is well known to use optical discs for data storage purposes. Recently, the need for greater storage capabilities has spurred interest in ways to store even greater amounts of data on optical discs. As a result, multi-layered optical discs have been developed. Examples of such multi-layered optical discs include, but are not limited to, Digital Versatile Discs.

Digital Versatile Discs are comprised of two plastic layers that are formed from a polycarbonate material and that are bonded to other portions of the optical disc, typically by use of an ultra-violet curable resin. Because polycarbonate is a hydrophilic plastic, the plastic layers will expand or shrink depending on the amount of moisture in the atmosphere. If one plastic layer shrinks or expands by a different amount than the other plastic layer, it may cause warping of the disc, thereby making the disc difficult, and in certain cases, impossible, to read by optical disc readers. To alleviate this problem, many multi-layered optical discs are manufactured so that the optical discs are symmetrical from a moisture absorption point of view. The two plastic layers essentially shrink or expand the same amount so that the amount of shrinkage or expansion by one of the plastic layers is equal to the amount of shrinkage or expansion of the other plastic layer. This shrinkage or expansion in each direction effectively cancels out, and therefore prevents warping of the disc.

Next generation multi-layered optical discs are being developed to hold even greater amounts of data, but the format of some of these next generation discs is not symmetrical (with respect to moisture absorption). Thus, polycarbonate material cannot be used in these next generation discs because of the disc warping problem described above. Moreover, other next generation optical discs are being developed that are designed to be read by light having lower wavelengths, including lights having wavelengths that approach 400 nm. Polycarbonate material has a low transparency, which means that polycarbonate material absorbs more light at lower wavelengths than other materials that have a higher transparency, such as cyclic-olefin material. As a result, optical discs having layers comprised of polycarbonate material cannot be read in players that use lower wavelength read lights, such as lights having a wavelength of 400 nm, as well as optical discs having layers comprised of other materials having a higher transparency. As a result, other materials having a higher transparency, such as cyclic-olefins, are often used in these other next generation discs, instead of polycarbonate.

Next generation optical discs often utilize substrates comprised of cyclic-olefin materials, such as Zeonex™ and Zeonor™ from Zeon Chemicals, and Topas® from Ticona, which is a division of Celanese AG. Cyclic-olefins are being used in multi-layered optical discs because they do not have the moisture absorption characteristics of polycarbonate, and because they have a higher transparency than polycarbonate. A drawback of using cyclic-olefins, however, is that they do not bond with adhesive materials well. As a result, the layers of multi-layered optical discs that are manufactured from cyclic-olefin separate easily, and the discs therefore have an increased susceptibility to delamination, thus rendering such discs essentially worthless.

Prior methods to improve the bonding ability of plastic layers of multi-layered discs to adhesives included exposing the plastic layer to an oxygen plasma by the use of a point source of the plasma. Although this method did improve the adhesive qualities of the optical disc, it presented several other problems and inefficiencies. For example, because a reactive plasma was used, the plasma overly degraded the surface of the substrate, causing undesired optical degradation of the read light when the disc was played in optical disc readers. Such optical degradation drastically diminishes, and in certain cases, completely destroys, the utility of the optical disc. Moreover, by using a point source to apply the ion plasma, the point source must be moved back and forth in a radial direction relative to the optical disc to treat areas of the disc at different radial distances from the center of the disc. The optical disc must also be rotated so that the point source can treat other portions of the disc. This process is difficult to control, because of the reactive plasma, and it is expensive and time consuming because of the inefficient point source used to expose the plastic layer to the plurality of ions.

Thus, there remains a need for a method of increasing the bonding ability of plastic layer(s) of multi-layered optical discs efficiently, and without overly degrading the surface of the plastic layer of the optical discs.

SUMMARY OF THE INVENTION

The present invention addresses the need for a method of increasing the bonding ability of plastic layer(s) of multi-layered optical discs efficiently, and without overly degrading the surface of the plastic layer of the optical discs.

A first aspect of the invention addresses the need to increase the bonding ability of the plastic layers in an efficient manner. Pursuant to a first embodiment of the invention, a gas is directed through an electric field to form a plurality of ions, and the plurality of ions are directed to the optical disc so that at least about 25%, and preferably, substantially all, of a width of the plastic layer is exposed to the plurality of ions at substantially the same time. By exposing at least about 25% of the width of the plastic layer to the plurality of ions, at least about 25% of the surface of the layer can be exposed to the plurality of ions by either moving the layer over a source of the ions in one direction, or by moving the source of the ions over the disc in one direction; but both the source and the disc do not have to be moved, and neither the source nor the disc have to be moved in two directions. This increases the efficiency and the practicality of exposing the plastic layer of the disc for increased bonding ability.

In a preferred embodiment, the electrical field is provided by two electrodes, and the plurality of ions are directed toward the optical disc by directing the ions into an ingress opening formed within an ion director. The ions are directed so that they exit the ion director through a plurality of egress openings, and the optical disc is positioned about three to five millimeters from the egress openings. In other embodiments, the optical disc can be positioned up to about 20 mm from the openings. The egress openings span the width of the plastic layer, so that the entire width of the layer is exposed to the plurality of ions.

In the preferred embodiment, the plastic layer is moved over the egress openings so that the entire surface of the plastic layer is exposed to the plurality of ions. As a result, the plastic layer, after being exposed to the plurality of ions, has greater bonding ability than it did prior to being exposed to the plurality of ions.

A second aspect of the present invention addresses the need for a method of increasing the bonding ability of plastic layers of multi-layered optical discs without overly degrading the surface of the optical discs. Pursuant to a second embodiment of the invention, a plastic layer of the optical disc is exposed to non-reactive ions. The non-reactive ions improve the bonding ability of the plastic layer of the optical disc, and, by using non-reactive ions, the plastic layer of the optical disc is not overly degraded. As a result, the undesirable effects of optically degrading the reader light when the optical disc is read in an optical disc reader is avoided.

In the preferred embodiment, the non-reactive ions are derived from a noble gas, and in one embodiment, are derived from Argon gas. In the preferred embodiment, a first surface of a plastic layer is exposed to the plurality of ions, an adhesive material is applied to the first surface, and a second layer is secured to the adhesive material so that the adhesive material is in contact with both the first surface of the first layer and the second layer. The first layer is comprised of cyclic-olefin, the adhesive material is an ultra-violet curable resin, and the second layer is a reflective layer of a second plastic layer.

A more complete understanding of the method of increasing the bonding ability of plastic layers of multi-layered optical discs will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 3 is a cross-sectional exploded view of a next generation optical disc showing a zero plastic layer and a first plastic layer separated from one another;

FIG. 4 is a cross-sectional view of a portion of a next generation optical disc; and, FIG. 5 is a schematic diagram of an apparatus that is capable of carrying out the steps of an alternate embodiment of the invention.

DETAILED DESCRIPTION OF THE PREFERRED EMBODIMENT

Figure 1:
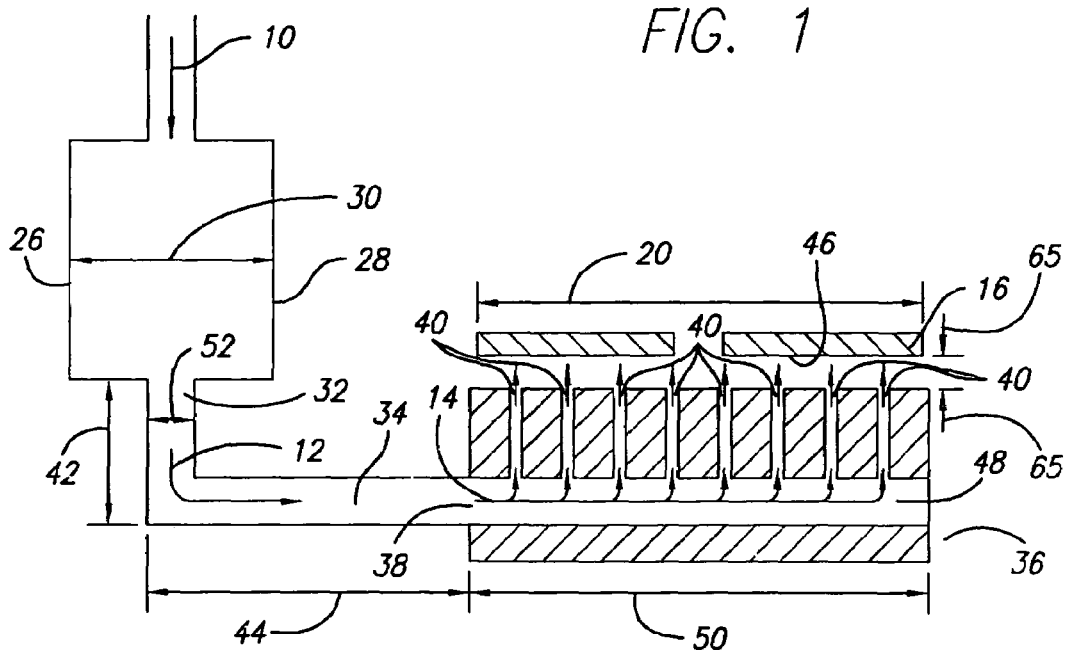
FIG. 1 is a schematic diagram showing a cross-sectional view of a nozzle used in an apparatus that can be used to carry out the steps of a first embodiment of the invention.

The invention is directed to exposing a plastic layer of a multi-layered optical disc to a plurality of ions in order to improve the ability of the plastic layer to bond to adhesive materials. It is believed that the ability of the plastic layer to bond to an adhesive material is improved because the ions create roughness on the surface of the plastic layer, increasing the surface area of the layer for bonding.

Pursuant to a first aspect of the invention, a gas is directed through an electric field to form a plurality of ions, and the plurality of ions are directed to the optical disc so that at least about 25%, and preferably, substantially all, of a width of the plastic layer is exposed to the plurality of ions at substantially the same time. (If the disc is circular, the width is the diameter of the disc.) By exposing the width of the plastic layer to the plurality of ions at about the same time, the surface of the layer can be exposed to the plurality of ions by either passing the optical disc over the source of ions once or by passing the source of the ions over the optical disc once. This increases the efficiency and the practicality of exposing the plastic layer of the disc to a plurality of ions for increased bonding ability. Pursuant to a second aspect of the invention, a plastic layer of the optical disc is exposed to non-reactive ions. The non-reactive ions improve the bonding ability of the plastic layer of the optical disc, and, by using non-reactive ions, the plastic layer of the optical disc is not overly degraded. As a result, the undesirable effects of optically degrading the reader light when the optical disc is read in an optical disc reader is avoided.

Prior methods to improve the bonding ability of plastic layers of multi-layered discs to adhesives included exposing the plastic layer to a plurality of reactive ions (such as an oxygen plasma). The plastic layers were comprised of cyclic-olefin. A point source was used to apply the reactive plasma to the disc, and although this method did improve the adhesive qualities of the optical disc, it presented several other problems and inefficiencies. For example, because a reactive plasma was used, the plasma overly degraded the surface of the substrate, causing undesired optical degradation of the read light when the disc was played in optical disc readers. Such optical degradation drastically diminishes, and in certain cases, completely destroys, the utility of the optical disc. Moreover, by using a point source to apply the ion plasma, the point source must be moved back and forth, in a radial direction, relative to the optical disc to treat areas of the disc at different radial distances from the center of the disc; and the optical disc must also be rotated so that the point source can treat other portions of the disc. This process is difficult to control because of the reactive plasma, and it is expensive and time consuming because of the inefficient point source used to expose the plastic layer to the plurality of ions.

The first aspect of the invention addresses the difficulties of using a point source to apply a plasma by directing a gas (shown by arrow 10 in FIG. 1) through an electric field 30 to form a plurality of ions of the gas, and by directing the plurality of ions (shown by arrows 12 and 14) to the plastic layer 16 of the disc 18 so that at least 25%, and preferably, substantially all, of the width 20 of the plastic layer of the optical disc is exposed to the plurality of ions at substantially the same time. In this manner, at least 25% of the width 20 of the plastic layer 16 of the optical disc 18 is exposed to the plurality of ions without moving the source of the plurality of ions. The plastic layer 16 can then be moved in one direction (shown by arrow 22 in FIG. 2) so that other portions 24 of the disc 18 are exposed to the plurality of ions. Rotation of the disc 18 and movement of the source of the ions is not necessary.

Figure 2:
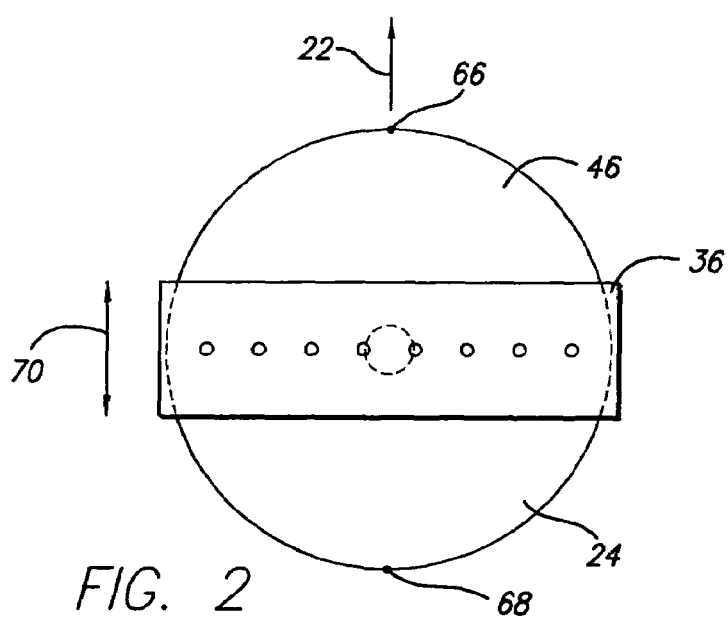
FIG. 2 is a top view of the nozzle and a surface of a plastic layer of an optical disc shown in FIG. 1.

An apparatus that can be used to practice a first embodiment of the invention is shown in FIG. 1. Pursuant to the first embodiment, a gas is directed (as shown by arrow 10) through an electric field 30. The gas can be directed through the electric field by way of a pump (not shown).

In one embodiment, the plurality of ions is created by exposing the gas to an electrical field 30 created by an alternating current of about 2 to 3 milliamperes (mA), two electrodes 26 and 28 having a voltage difference between them of about 20 to 30 kilovolts (kv), and by directing the gas through the electrical field at a rate of about 30 to about 50 cubic feet per hour (which is approximately 14,160 to about 23,600 cubic centimeters per second). Note that the flow of the gas can be increased, and to maintain a satisfactory number and density of ions for improving the bonding ability of the plastic layer 16, the voltage of the electric field should be increased.

In the first embodiment shown in FIG. 1, the plurality of ions are directed to the plastic layer 16 of the optical disc 18, as shown by arrows 12 and 14, so that at least about 25%, and preferably, substantially all, of the width 20 of the layer 16 is exposed to the plurality of ions at substantially the same time. The plurality of ions are directed (as shown by arrows 12 and 14) to the plastic layer 16 by the use of tubes 32 and 34, and by an ion director 36 having an ingress opening 38 and a plurality of egress openings 40. The length 42 and 44 of the tubes 32 and 34 is based in part on the amount of time ions are formed by removing an electron from neutral gas molecules, and the ions react with other molecules when exposed to the environment. Thus, the longer the amount of time the ions are exposed to the environment, before contacting the plastic layer 16, the more susceptible the ions are to losing their charge and thereby not increasing the bonding ability of the plastic layer 16. It should also be noted that the density of the plurality of ions that are exposed to the plastic layer 16 need not be uniform. Thus, for example, a greater amount of ions may contact one portion of the surface 46 of the plastic layer 16 than another portion of the surface of the plastic layer without affecting the increased bonding ability resulting from the plurality of ions.

In the first embodiment, the plurality of ions are directed into the ingress opening 38 of the ion director 36 and are then separated by exiting the ion director through a plurality of egress openings 40. In the preferred embodiment shown in FIG. 1, the entire width 20 of the plastic layer 16 is exposed to the plurality of ions. Thus, in the preferred embodiment, the egress openings 40 span the entire width 20 (or diameter in the case of circular discs) of the plastic layer 16. In the preferred embodiment, the ion director 36 is a nozzle having one ingress opening 38 in flow communication with a pathway 48 that is in flow communication with the plurality of egress openings 40. The nozzle 36 is used to direct the plurality of ions to the plastic layer 16 (of a circular disc) having a diameter of 120 mm. The length 50 of the nozzle is about 130 mm, and includes ten equally spaced egress openings 40. It should be understood that all of the egress openings are not shown in FIG. 1 for ease of description. Note that other embodiments can include more than ten egress openings 40 formed therein. The pathway 48 has a circular cross-section that has a diameter of about 6 mm, and the tubes 32 and 34 have a total length of about 10 cm (such that a sum of the distances denoted by numerals 42 and 44 is about 10 cm); the tubes 32 and 34 have a circular cross section that has a diameter 52 of about 6 mm. Note that, in other embodiments of the nozzle, there may be as little as two egress openings 40 that cover at least about 25% of the width 20 of the plastic layer 16.

Note that although the ion director is shown having a plurality of egress openings 40, in an alternate embodiment shown in FIG. 5, the ion director 54 may include an ingress opening 56 and an elongated egress opening 58 that spans at least about 25% of the width 20 of the layer, and preferably, spans substantially all of the width 20. In the alternate embodiment, the plurality of ions exit the egress opening 58, as shown by arrows 62, through different portions 60 and 64 of the elongated egress opening 58 so that substantially all of the width 20 of the layer 16 is exposed to the plurality of ions. Further, it should be noted that the ion director may comprise several articles working in conjunction with one another, such as, for example, a tube having one ingress opening in flow communication with other tubes, the ends of which comprise egress openings.

The plastic layer 16 of the optical disc 18 is positioned over the egress openings 40, 58 by a distance 65 so that the ions can contact the surface 46 of the layer 16 of the optical disc 18 while the ions still have a charge. In the preferred embodiment, the plastic layer 16 is positioned so that the surface 46 is spaced by a distance 65 of about 3 to about 5 mm from the egress openings 40 and 58. Note that in other embodiments, the surface 46 can be spaced from the egress openings 40 and 58 by a distance 65 of up to about 20 mm.

In the first embodiment, at least about 25%, and preferably, substantially all, of the surface 46 of the plastic layer 16 is exposed to the plurality of ions. In a preferred embodiment, the layer 16 is passed across the egress openings 40 of the nozzle 36, as shown by arrow 22 in FIG. 2, so that all of the surface 46 of the plastic layer 16 is passed across the egress openings 40 and 58 in about 1 second, and in other embodiments, can be passed over the openings in less than 1 second. Note that in other embodiments, the surface 46 is passed across the egress openings 40 and 58 in about 5 seconds. The entire surface 46 is exposed to the plurality of ions in one pass. In other embodiments, the nozzle 36 may be passed across the layer 16 (as shown by arrow 70) so that the plurality of egress openings 40 pass over the layer from point 66 to point 68.

The second aspect of the invention addresses the problem of undesirable surface degradation by exposing the plastic layer 16 of the optical disc 18 to a plurality of ions of a non-reactive gas. The non-reactive ions increase the bonding ability of the plastic layer 16 to bond to an adhesive material 72 while still not overly degrading the surface of the plastic layer 16. In a preferred embodiment, an Argon plasma is used. Other ions that should increase the bonding ability of the plastic layer 16 while still not degrading the surface 46 of the disc include ion plasmas derived from noble gasses, and do not include oxygen ions.

One embodiment of a next generation disc 18 is shown in FIG. 4. The disc includes a zero layer 74, comprised of plastic, a reflective layer 76 above the zero layer, an adhesive layer 78, a first layer 16, comprised of plastic, a reflective layer 80 above the first layer, and a protective layer 82. Typically, the zero 74 and first 76 layers are comprised of cyclic-olefin.

In a second embodiment, the non-reactive ions are applied to the first surface 46 of the first layer 16. In other embodiments, non-reactive ions are applied to the second surface 84 of the zero layer 74 of the optical disc 18. A reflective layer 76 can then be applied to the second surface 84 of the zero layer 74 so that the reflective layer 76 covers portions of the zero layer, but not all of the zero layer.

Pursuant to the second embodiment, the first surface 46 of the first plastic layer 16 is treated with an adhesive material 72, after having the non-reactive ions applied thereto. For example, as shown in FIG. 3, the adhesive material 72 may be added to the first side 46 of the first layer 16 in the form of a continuous circular bead around an opening of the first layer 16. Note that in other embodiments, the adhesive material 72 may also be added to other layers, such as the reflective layer 76 above the zero layer 74.

Examples of adhesive materials that may be used, include, without limitation, ultra-violet (UV) curable resins, cationic resins, anionic resins, and epoxy resin. Preferably, a UV curable resin is used.

In the second embodiment, the first surface 46 of the first layer 16 is then secured (as shown by arrow 86 in FIG. 3) to a top surface 88 of the reflective layer 76, which reflective layer 76 has been applied to the second surface 84 of the zero layer 74. The first layer 16 with the reflective layer 76 and the zero layer 74 secured thereto is then spun so that the adhesive material 72 spreads throughout the first surface 46 of the first layer 16 and the top surface 88 of the reflective layer.

A portion of the disc 18, with layer zero 74 and layer one 16 secured to one another, is shown in FIG. 4. In embodiments that use a UV curable resin as the adhesive material 72, the disc 18 is exposed to a UV light to cure the UV resin to the first side of the first layer and the top side of the reflective layer.

Note that although the disc 18 shown in the figures has a specific configuration, those skilled in the art will appreciate that the present invention is also applicable to optical discs having different configurations. Further, although problems of bonding cyclic-olefins have been described above, the present invention can be used in conjunction with other layers comprised of other plastics, such as, without limitation, layers comprised of polycarbonate plastics, to increase the bonding ability of such layers.

Having thus described a preferred embodiment of a method to expose a multi-layered optical disc with a plurality of ions, it should be apparent to those skilled in the art that certain advantages of the within system have been achieved. It should also be appreciated that various modifications, adaptations, and alternative embodiments thereof may be made within the scope and spirit of the present invention. For example, exposing a plurality of ions to multi-layered optical discs having layers comprised of cyclic-olefin has been illustrated, but it should be apparent that the inventive concepts described above would be equally applicable to multi-layered optical discs having layers comprised of other plastics, such as, polycarbonate plastic. The invention is further defined by the following claims.

What is claimed is:

1. A method treating a plastic layer of an optical disc to improve surface adhesion properties, comprising:
   discharging a gas comprising a plurality of non-reactive gaseous ions at a volumetric rate in the range of about 30 to 50 cubic feet per hour through at least one nozzle so as to direct one or more gaseous streams in a pattern substantially spanning a diameter of the optical disc;
   moving a first side of a first plastic layer for an optical disc across the at least one nozzle during the discharging step, wherein the optical disc is located so that the one or more gaseous streams reach the optical disc while still comprising the plurality of non-reactive gaseous ions, and the moving step is continued until substantially all of the first side of the plastic layer has been exposed to the one or more gaseous streams; and,
   removing the first plastic layer from the at least one nozzle after the moving step.

2. The method of claim 1, wherein the step of directing gas molecules further comprises directing noble gas molecules through an electric field.

3. The method of claim 1, wherein the step of directing gas molecules further comprises directing Argon gas molecules through an electric field.

4. The method of claim 1, wherein the discharging step further comprises discharging the one or more gaseous streams through a plurality of nozzles.

5. The method of claim 1, wherein the discharging step further comprises discharging the one or more gaseous streams through a nozzle having an elongated egress opening.

6. The method of claim 1, wherein the discharging step further comprises discharging the one or more gaseous streams through an plurality of egress openings arranged in a linear pattern.

7. The method of claim 1, wherein the moving step further comprises locating the optical disc less than 20 mm from the nozzle.

8. The method of claim 1, wherein the discharging step is performed in an ambient atmosphere.

9. The method of claim 1, further comprising supplying the gas comprising the plurality of non-reactive gaseous ions by passing the gas between electrodes having a differential voltage.

10. The method of claim 1, further comprising supplying the gas comprising the plurality of non-reactive gaseous ions by passing the gas between electrodes having a differential voltage in the range of about 20 to 30 kilovolts.

11. The method of claim 1, wherein the discharging step further comprises discharging the gas at a volumetric rate in the range of about 30 to 50 cubic feet per hour at atmospheric pressure.

12. The method of claim 1, further comprising adhering the plastic layer to a second plastic layer to form an optical disc.

13. The method of claim 12, further comprising applying a reflective layer to the first side of the plastic layer prior to the adhering step.

14. The method of claim 13, further comprising applying an adhesive material over the reflective layer.

15. A multi-layered optical disc manufactured by the process of claim 12.

16. A multi-layered optical disc manufactured by the process of claim 14.

17. The method of claim 1, further comprising providing the first plastic layer comprised of a cyclic-olefin material.

18. A method treating a plastic layer of an optical disc to improve surface adhesion properties, comprising:
   discharging a gas comprising a plurality of non-reactive gaseous ions through at least one nozzle having an elongated egress opening so as to direct one or more gaseous streams in a pattern substantially spanning a diameter of the optical disc;
   moving a first side of a first plastic layer for an optical disc across the at least one nozzle during the discharging step, wherein the optical disc is located so that the one or more gaseous streams reach the optical disc while still comprising the plurality of non-reactive gaseous ions, and the moving step is continued until substantially all of the first side of the plastic layer has been exposed to the one or more gaseous streams; and,
   removing the first plastic layer from the at least one nozzle after the moving step.

19. A method treating a plastic layer of an optical disc to improve surface adhesion properties, comprising:
   discharging a gas comprising a plurality of non-reactive gaseous ions through a plurality of egress openings arranged in a linear pattern so as to direct one or more gaseous streams in a pattern substantially spanning a diameter of the optical disc;

moving a first side of a first plastic layer for an optical disc across the at least one nozzle during the discharging step, wherein the optical disc is located so that the one or more gaseous streams reach the optical disc while still comprising the plurality of non-reactive gaseous ions, and the moving step is continued until substantially all of the first side of the plastic layer has been exposed to the one or more gaseous streams; and, removing the first plastic layer from the plurality of egress openings after the moving step.

* * * * *